(12) United States Patent
Zhu

(10) Patent No.: US 6,559,517 B2
(45) Date of Patent: May 6, 2003

(54) STRUCTURE FOR A SEMICONDUCTOR DEVICE

(76) Inventor: En Jun Zhu, 5974 Buckingham Pkwy. #501, Culver City, CA (US) 90230

( * ) Notice: Subject to any disclaimer, the term of this patent is extended or adjusted under 35 U.S.C. 154(b) by 0 days.

(21) Appl. No.: 09/842,555

(22) Filed: Apr. 26, 2001

(65) Prior Publication Data

US 2002/0000640 A1 Jan. 3, 2002

Related U.S. Application Data

(60) Provisional application No. 60/200,138, filed on Apr. 27, 2000.

(51) Int. Cl.⁷ .................. H01L 27/082; H01L 27/102; H01L 29/70
(52) U.S. Cl. ........................... 257/591; 257/565
(58) Field of Search ................ 257/565, 571, 257/578, 579, 586, 587, 588, 591, 593, 580, 581, 582; 438/204, 313, 319

(56) References Cited

U.S. PATENT DOCUMENTS

| | | | |
|---|---|---|---|
| 4,871,684 A | | 10/1989 | Glang et al. |
| 5,101,256 A | | 3/1992 | Harame et al. |
| 5,289,024 A | * | 2/1994 | Ganschow ............ 257/592 |
| 5,583,059 A | * | 12/1996 | Burghartz ............ 438/319 |
| 5,603,765 A | | 2/1997 | Matloubian et al. |
| 5,981,985 A | | 11/1999 | Yang et al. |
| 6,180,478 B1 | | 1/2001 | Lee et al. |
| 6,198,156 B1 | | 3/2001 | Johansson et al. |
| 6,218,254 B1 | | 4/2001 | Singh et al. |
| 6,271,577 B1 | * | 8/2001 | Havemann ............ 257/592 |
| 6,396,126 B1 | * | 5/2002 | Tsai et al. ............ 257/565 |
| 2001/0013636 A1 | * | 8/2001 | Dunn et al. ............ 257/565 |
| 2001/0017379 A1 | * | 8/2001 | Tsai et al. ............ 257/197 |

FOREIGN PATENT DOCUMENTS

JP    356051860 A * 5/1981 ............ 257/571

OTHER PUBLICATIONS

RF Micro Devices Introduces Trio of GaAs HBT Amplifiers, RF Micro Devices, Dec. 11, 2000, pp. 1–2.
HP Offers High Dynamic Range, Low–noise Isolated–collector Silicon Bipolar Junction Transistor for RF Applications, Agilent, Feb. 22, 1999, pp. 1–3.
High Volume Production of AlGaAs/GaAs Heterojunction Bipolar Transistors, N. Pan, D. Hill, C. Rose, D. McCullough, P. Rice,D. P. Vu, Kopin Corp.; K. Hong, C. Farley, Rockwell Semiconductor Systems, Date Unknown, pp. 1–4.

* cited by examiner

Primary Examiner—Tom Thomas
Assistant Examiner—Douglas W. Owens
(74) Attorney, Agent, or Firm—Cantor Colburn LLP

(57) ABSTRACT

An exemplary embodiment of the invention is a semiconductor device comprising a substrate of a first conductivity type and a subcollector of a second conductivity type provided on the substrate. An intrinsic epitaxial layer is formed on the substrate. A collector region of the second conductivity type is adjacent the subcollector and a base region of the first conductivity type is adjacent the collector region. An emitter region of the second conductivity type is adjacent the base region and the emitter region has an emitter size. The subcollector and collector region both have a size not substantially greater than the emitter size. An alternate embodiment includes a spacer layer formed between the emitter region and the base region.

15 Claims, 4 Drawing Sheets

STRUCTURE FOR A SEMICONDUCTOR DEVICE

CROSS-REFERENCE TO RELATED APPLICATIONS

This application claims the benefit of U.S. provisional patent application Ser. No. 60/200,138, filed Apr. 27, 2000, the entire contents of which are incorporated herein by reference.

BACKGROUND OF THE INVENTION

The invention relates generally to semiconductor devices and in particular to semiconductor devices for use in amplifiers for high frequency applications. FIG. 1 depicts a cross section of a conventional BJT 100. As shown in FIG. 1, the conventional BJT 100 is formed on a silicon substrate 102 of a second conductivity type (e.g., N type) upon which an epitaxial layer 104 is deposited. The epitaxial layer 104 may be a second conductivity type and form part of the collector. A base region 106 having a first conductivity type (e.g., P type) is formed in the epitaxial layer 104. An insulating layer 108, such as $SiO_2$, is formed over the base region 106. Windows are formed in insulative layer 108 to provide access for metallic connections 110 to the base region and for the emitter region. An emitter region 112 made of polysilicon having a second conductivity type is formed in connection with the base region 106 and an emitter contact 114 is provided. Substrate 102 provides a sub-collector, contact with which may be made from the bottom surface of the substrate. Multiple BJT's 100 may be formed on a common substrate with the subcollectors typically isolated from each other by suitable technology.

A drawback to the conventional BJT 100 is that the whole transistor is fabricated on the subcollector area 102. Such a design yields high parasitic collector capacitance which results in poor performance of BJT 100 in high frequency applications. The variation of collector capacitance with bias results in poor linearity in power amplification applications.

BRIEF SUMMARY OF THE INVENTION

An exemplary embodiment of the invention is a semiconductor device comprising a substrate of a first conductivity type and a subcollector of a second conductivity type provided on the substrate. An intrinsic epitaxial layer is formed on the substrate. A collector region of the second conductivity type is adjacent the subcollector and a base region of the first conductivity type is adjacent the collector region. An emitter region of the second conductivity type is adjacent the base region and the emitter region has an emitter size. The subcollector and collector region both have a size not substantially greater than the emitter size. An alternate embodiment includes a spacer layer formed between the emitter region and the base region.

BRIEF DESCRIPTION OF THE DRAWINGS

Referring now to the drawings, wherein like elements are numbered alike in the several FIGURES.

DETAILED DESCRIPTION

Figure 1:
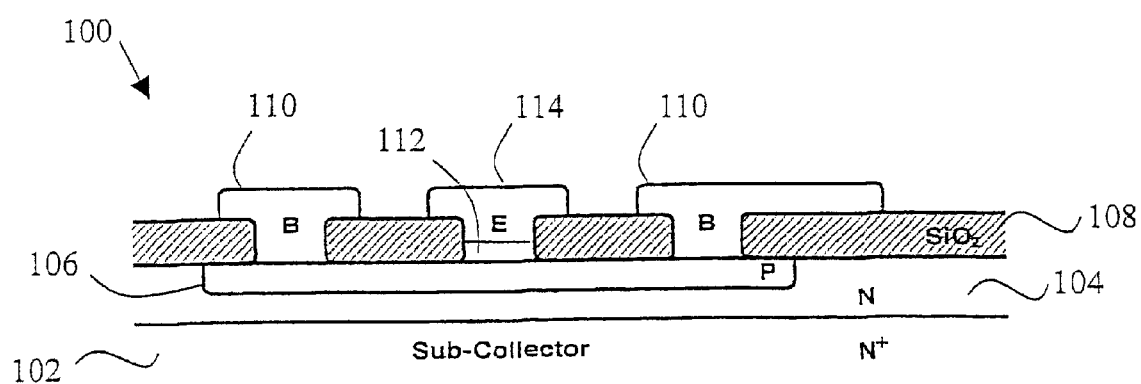
FIG. 1 is a cross-section view of a conventional BJT.
Figure 2:
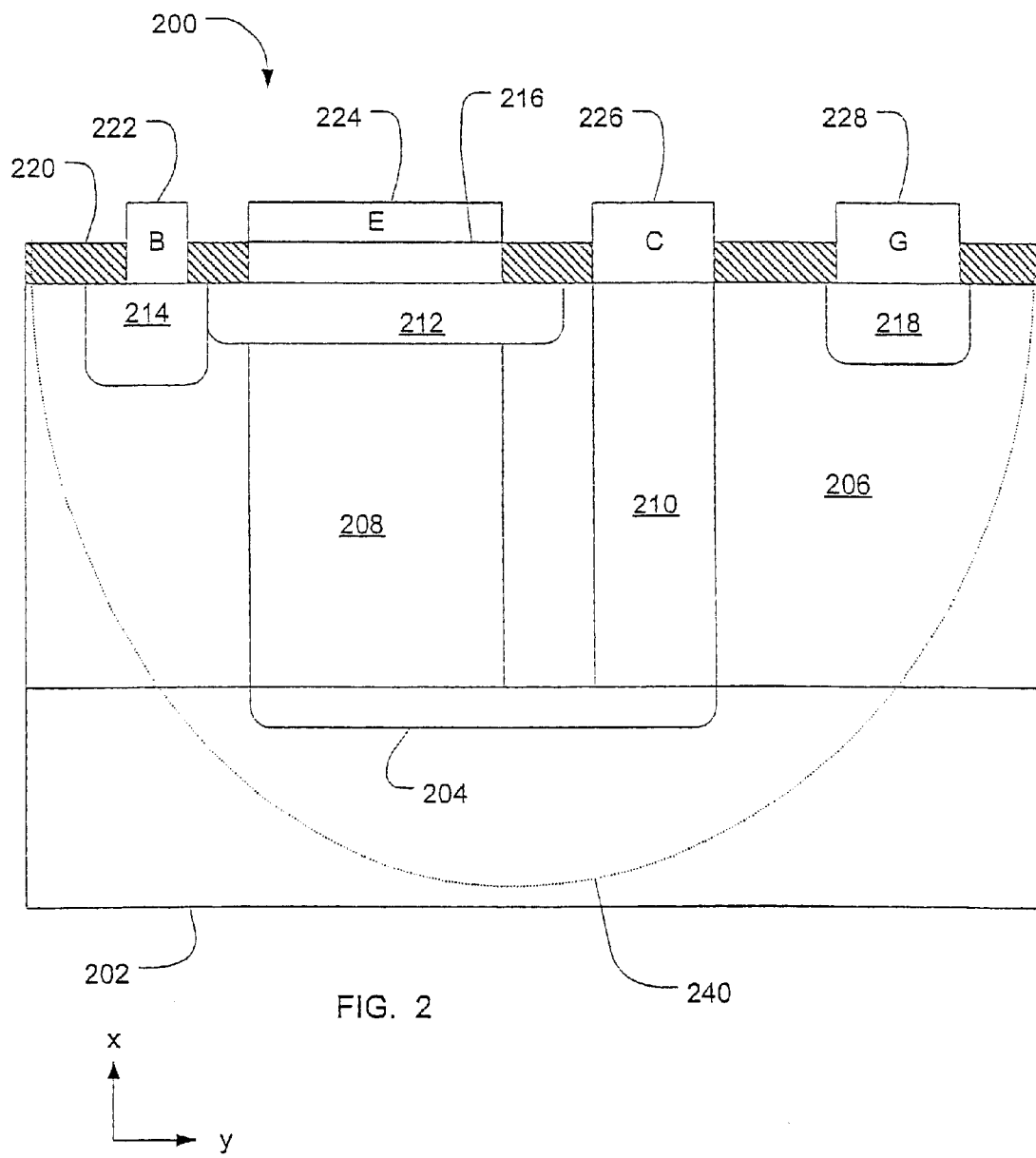
FIG. 2 is a cross-sectional view of a BJT in an embodiment of the invention.

FIG. 2 is a cross-sectional view of a BJT 200 in an exemplary embodiment of the invention. In an exemplary embodiment, the BJT is made from silicon materials, thus reducing cost yet providing performance that surpasses conventional HBT's. BJT 200 includes a substrate 202 which may be a silicon wafer of a first conductivity type (e.g., p type). In an exemplary embodiment, the substrate 202 is a highly resistive, $P^-$ type silicon wafer. A subcollector 204 is formed in the substrate 202 using known techniques. The subcollector 204 has a second conductivity type (e.g., n type). In an exemplary embodiment, the subcollector 204 is an $N^+$ type silicon. As described herein, the subcollector 204 is positioned so as to overlap a minimal portion of the remainder of the BJT 200. This reduced amount of overlap reduces collector capacitance and thus increases performance, particularly in high frequency applications.

Once the subcollector 204 is formed, an epitaxial process is used to form an intrinsic epi-layer 206. The intrinsic epi-layer 206 may have a first conductivity type or a second conductivity type and is preferably a highly resistive silicon layer. A collector region 208 is formed in the intrinsic epi-layer 206 and is in contact with a first portion of the subcollector 204. The collector region 208 may be formed through ion implantation to form a collector having a second conductivity type. In an exemplary embodiment, the collector region 208 is an N type silicon region.

A conductive region 210 is also formed in the intrinsic epi-layer 206 and is in contact with a second portion of the subcollector 204. The conductive region 210 may be formed through ion implantation to form a conductive region having a second conductivity type. In an exemplary embodiment, the conductive region 210 is an $N^+$ type silicon region. The conductive region 210 provides a conductive path from the subcollector to the top surface of the BJT 200.

A base region 212 having a first conductivity type is formed above, and in contact with, the collector region 208. Base region 212 is formed using known techniques and in an exemplary embodiment is a P type silicon. The base region 212 may be connected to a base metal contact 222 through an intermediate base region 214 having the first conductivity type. In an exemplary embodiment, intermediate base region 214 is a $P^+$ type silicon.

A ground region 218 having a first conductivity type may also be formed in the intrinsic epi-layer 206. In an exemplary embodiment of the invention, the ground region 218 is a $P^+$ type silicon. If the ground region 218 does not have the same conductivity type as the intrinsic epi-layer 206, then the ground region 218 should extend through the intrinsic epi-layer 206 to contact the substrate 202. Positioning the ground region 218 and associated ground metal contact 228 on the top surface of the BJT 200 reduces inductance to ground as compared with conventional structures.

An insulative layer 220 (e.g., $SiO_2$) is formed over the top of BJT 200. Windows are formed in insulative layer 220 for an emitter region 216 and metal contacts 222, 224, 226 and 228 for connection with base region 212, emitter region 216, conductive region 210 and ground region 218, respectively. The emitter region 216 having a second conductivity type is formed on the base region 212 using known techniques. In an exemplary embodiment, emitter region 216 is a $N^+$ type polysilicon. The structure of FIG. 2 provides a vertical BJT formed entirely in silicon.

The resistivity of the substrate 202 and intrinsic epi-layer 206 is high enough to form a depleted region indicated by dashed line 240. The depleted region surrounds the collector region 208, subcollector 204 and conductive region 210. Even at zero bias, the depleted region is thick enough to isolate the BJT 200 from other components on the same substrate 202. In the case of multiple BJTs 200 formed in an integrated circuit, the metal contacts for the base, emitter, collector and ground are positioned and the resistivity of the substrate 202 and intrinsic epi-layer 206 is chosen so that no punch through occurs between the subcollectors 204 of different devices. The depleted region provides a self-isolation structure eliminating the need for other isolation mechanisms required in conventional structures.

Figure 3:
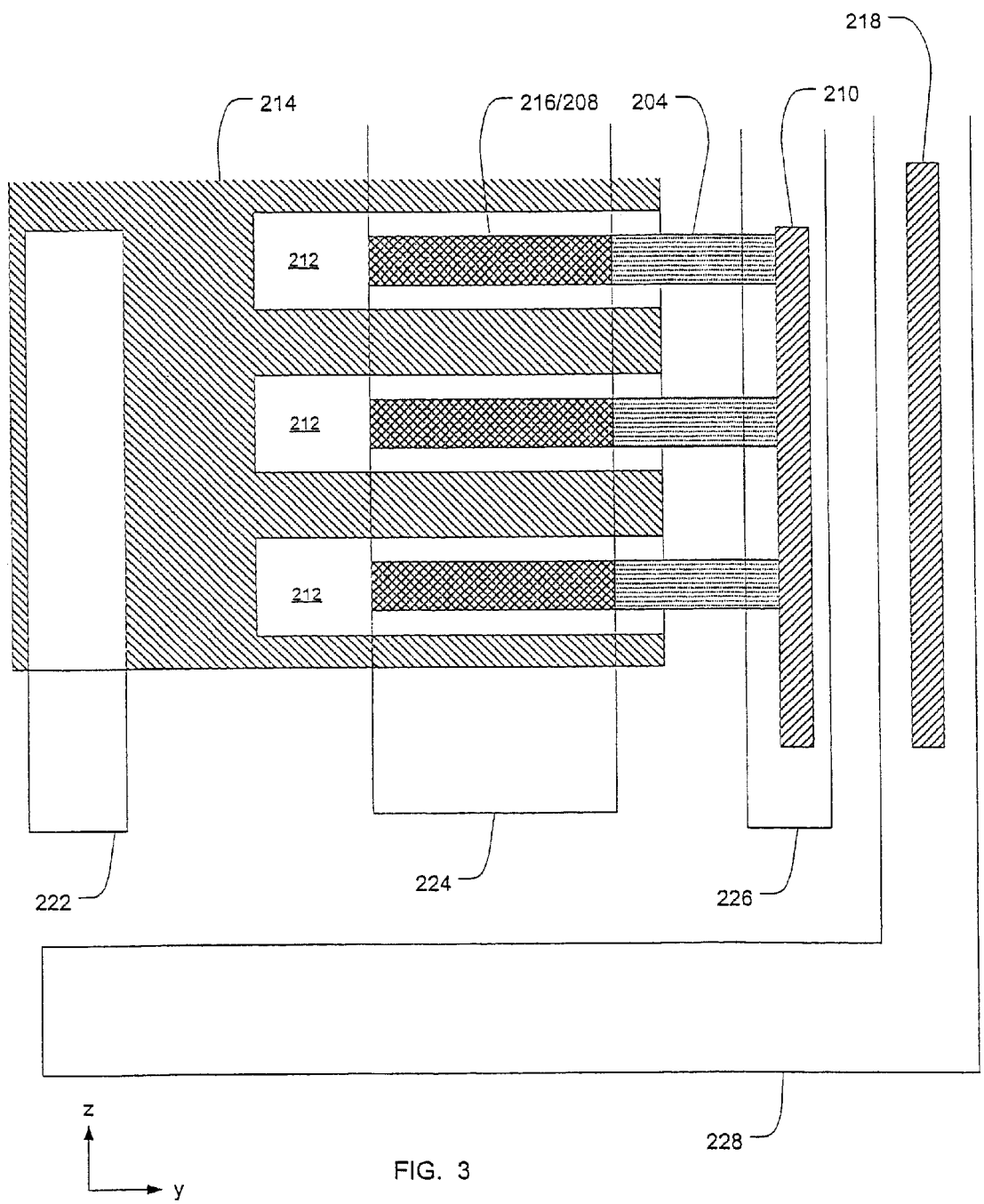
FIG. 3 is a top view of the BJT of FIG. 2.

FIG. 3 is a top view of the BJT 200 having several emitter cells. For sake of reference, the BJT 200 has a depth measured along an x axis, a length measured along a y axis and a width measured along a z axis. It is understood that the depth, length and width are relative designations and are not intended to limit the invention. The subcollector 204 is structured so that a reduced amount of overlap occurs between the subcollector 204 and the remainder of the BJT 200. As shown in FIG. 3, the subcollector 204 has a width along the z axis substantially equal to the width of the emitter region 216. Thus, the subcollector 204 may be characterized as having a width not substantially greater than the emitter region width. The length of the subcollector 204 along the y direction is such that a first subcollector edge terminates substantially equal with (e.g., may extend slightly beyond) the edge of the emitter region 216 and a second subcollector edge terminates substantially equal with (e.g., may extend slightly beyond) the edge of the conductive region 210. This results in minimal overlap with base region 212. The collector region 208 has length along the y axis substantially equal to the length of emitter region 216. Collector region 208 also has a width along the z axis substantially equal to the width of the emitter region 216. The reduced overlap between the subcollector 204, the collector region 208 and remaining regions of the BJT reduces the collector capacitance and improves performance, particularly in high frequency linear amplification applications.

Although the exemplary embodiment has been described with reference to an all-silicon BJT, the technology of reduced subcollector and collector overlap may be utilized jointly or individually in other semiconductor devices that transport current vertically such as static induction transistors (SITs), etc. In an SIT, the source, gate, drain and subdrain correspond to the emitter, base, collector and subcollector described above. Thus, the terms emitter, base, collector and subcollector are intended to encompass similar components (e.g., source, gate, drain and subdrain) in alternate devices. Other semiconductor materials such as SiC—GaN may also be used to implement the invention.

Figure 4:
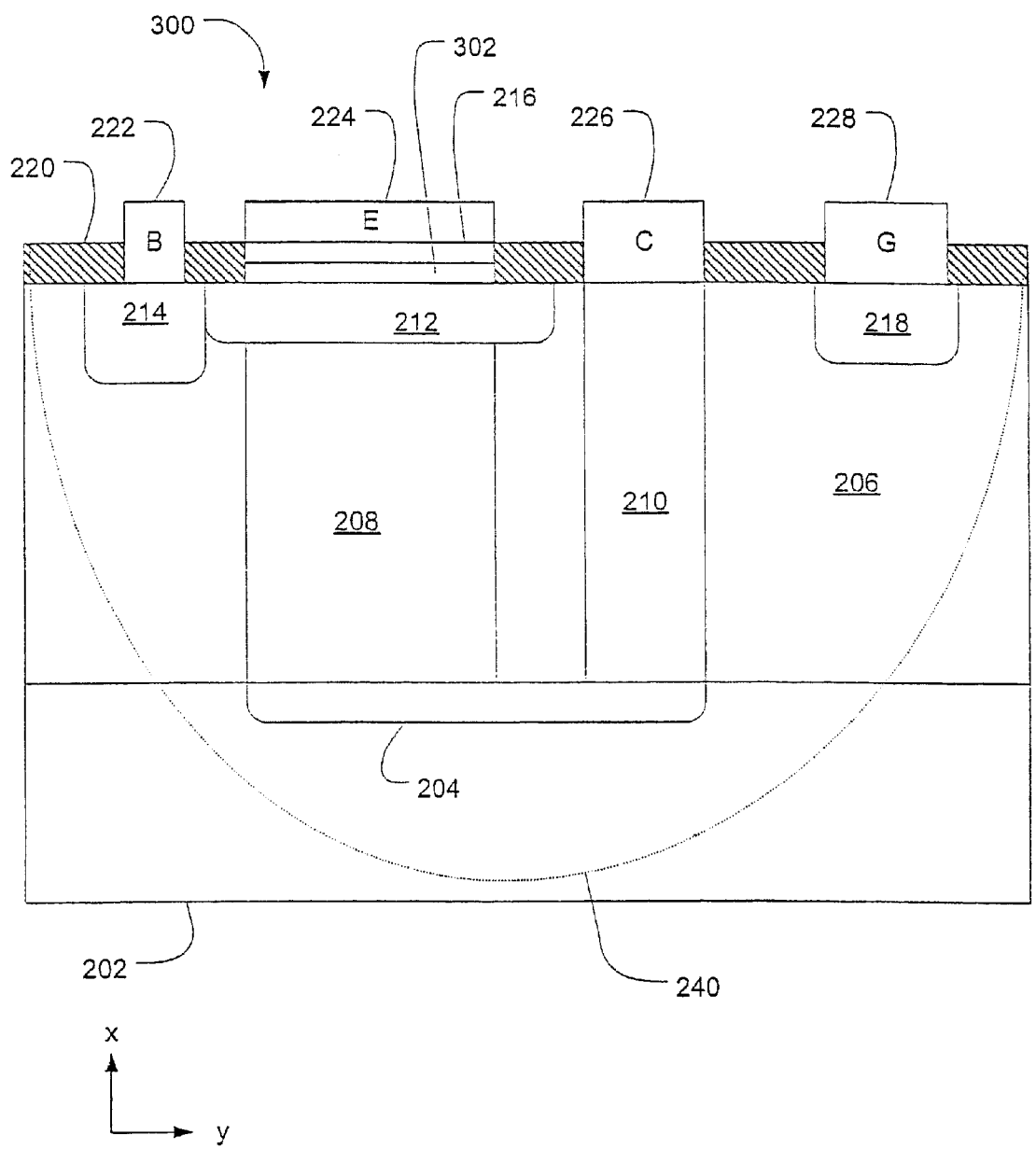
FIG. 4 is a cross-sectional view of a BJT in an alternate embodiment of the invention.

In an alternate embodiment of the invention, a spacer layer is formed between the emitter region and the base region. FIG. 4 is a cross-sectional view of a BJT 300 in an alternate embodiment of the invention. BJT 300 is similar to BJT 200 in FIGS. 2 and 3 with the exception of spacer layer 302 formed between the emitter region 216 and the base region 212.

In conventional polysilicon emitter BJTs, the heavily doped emitter contacts the base directly so that the E-B junction depletion layer is very thin which results in the E-B junction capacitance $C_{eb}$ being large. In addition, the doping of the base must be limited to prevent tunnel conduction. The base thickness must exceed a minimum value resulting in a higher base transit time $t_b$. If the base thickness is too thin, this results in an increased base resistance $r_b$ and a reduced early voltage Va. All these factors negatively affect performance by imposing limits on $C_{eb}$, $t_b$, $r_b$ and $V_a$.

In order to overcome these difficulties, an embodiment of the invention shown in FIG. 4 includes a thin (e.g. about 200 Å to about 400 Å), high purity intrinsic (I-type) silicon spacer layer 302 provided between the emitter region 214 and the base region 212. In an exemplary embodiment, the spacer layer 302 has external dimensions (e.g., length and width) substantially equal to those of the emitter region 214. The spacer layer 302 reduces the E-B capacitance by several factors (e.g., approximately 3–5 times lower). In addition, the doping concentration of the base region 212 can be raised without tunnel conduction occurring, and the base thickness can be reduced. These enhancements enable the base transit time $t_b$ to be reduced thereby increasing $f_t$ enhancing performance. The base resistance $r_b$ is maintained at a relatively low level while maintaining a sufficiently high Early voltage.

Formation of the spacer layer 302 may be performed using a low temperature epitaxy technology such as MBE or high vacuum CVD to keep the emitter-spacer-base junction abrupt thereby preventing the current gain from dropping. The material quality of the spacer layer 302 should have a purity sufficient to insure ballistic electron motion across the spacer layer 302. Otherwise, the transit time across the E-B junction will be raised.

The reduced subcollector and collector overlap as described with reference to FIGS. 2 and 3 and the inclusion of the spacer layer 302 described with reference to FIG. 4 may be used in combination. Such improvements increase the high frequency performance of the BJT by improving factors such as $C_c$, $C_{eb}$, $V_b$, $t_b$. As a result, a BJT formed in accordance with the embodiments of the invention can replace existing GaAs HBT's in most high speed high frequency applications.

While the invention has been described with reference to exemplary embodiments, it will be understood by those skilled in the art that various changes may be made and equivalents may be substituted for elements thereof without departing from the essential scope thereof. Therefore, it is intended that the invention not be limited to the particular embodiments disclosed for carrying out the invention, but that the invention will include all embodiments falling within the scope of the appended claims.

What is claimed is:

1. A semiconductor device comprising:
    a substrate of a first conductivity type;
    an intrinsic epi-layer on the substrate;
    a subcollector of a second conductivity type provided on the substrate;
    a collector region of the second conductivity type adjacent the subcollector;
    a base region of the first conductivity type adjacent the collector region; and
    an emitter region of the second conductivity type adjacent the base region, the emitter region having an emitter width and an emitter length;
    said subcollector having a subcollector width substantially equal to the emitter width,
    said collector region having a collector width substantially equal to the emitter width;
    said collector region having a collector length substantially equal to the emitter length.
2. The semiconductor device of claim 1 wherein:
    said first conductivity type is p type.
3. The semiconductor device of claim 1 wherein:
    said second conductivity type is n type.
4. The semiconductor device of claim 1 wherein:
    said device is a BJT.

5. The semiconductor device of claim 1 wherein:
said device is an SIT.

6. The semiconductor device of claim 1 wherein:
said subcollector, collector region, base region and emitter region each include silicon.

7. The semiconductor device of claim 1 wherein:
said subcollector, collector region, base region and emitter region each consist of silicon.

8. The semiconductor device of claim 1 further comprising:
a conductive region of the second conductivity type adjacent to the subcollector.

9. The semiconductor device of claim 8 further comprising:
a base contact in electrical connection with said base region;
an emitter contact in electrical connection with said emitter region; and
a collector contact in electrical connection with said collector region;
wherein said base contact, emitter contact and collector contact are formed on a common surface.

10. The semiconductor device of claim 9 wherein:
said collector contact is in electrical connection with said collector region through said conductive region and said subcollector.

11. The semiconductor device of claim 1 further comprising:
a ground region of the first conductivity type adjacent the intrinsic epi-layer.

12. The semiconductor device of claim 11 further comprising:
a ground contact in electrical connection with said ground region.

13. The semiconductor device of claim 1 further comprising:
a spacer layer positioned between said emitter region and said base region.

14. The semiconductor device of claim 13 wherein:
said spacer layer includes an intrinsic silicon.

15. A semiconductor device comprising:
a substrate of a first conductivity type;
a subcollector of a second conductivity type provided on the substrate;
a collector region of the second conductivity type adjacent the subcollector;
a base region of the first conductivity type adjacent the collector region;
an emitter region of the second conductivity type adjacent the base region; and
a spacer layer positioned between said emitter region and said base region wherein said spacer layer includes an intrinsic silicon.

* * * * *